US 8,917,519 B2

(12) United States Patent
Sano

(10) Patent No.: US 8,917,519 B2
(45) Date of Patent: Dec. 23, 2014

(54) CIRCUIT BOARD FIXING DEVICE

(71) Applicant: Denso Corporation, Kariya (JP)

(72) Inventor: Yoshimasa Sano, Anjo (JP)

(73) Assignee: Denso Corporation, Kariya (JP)

( * ) Notice: Subject to any disclaimer, the term of this patent is extended or adjusted under 35 U.S.C. 154(b) by 228 days.

(21) Appl. No.: 13/724,001

(22) Filed: Dec. 21, 2012

(65) Prior Publication Data

US 2013/0170160 A1  Jul. 4, 2013

(30) Foreign Application Priority Data

Dec. 28, 2011 (JP) ................................ 2011-287974

(51) Int. Cl.
  *H05K 5/00* (2006.01)
  *H05K 5/02* (2006.01)
  *H05K 7/14* (2006.01)

(52) U.S. Cl.
  CPC ............ *H05K 5/0221* (2013.01); *H05K 5/0013* (2013.01); *H05K 7/1417* (2013.01)
  USPC ........... 361/756; 361/801; 361/802; 361/752; 206/706; 206/707

(58) Field of Classification Search
  CPC .... H05K 5/0004; H05K 5/006; H05K 5/0039
  USPC ......... 361/752, 756, 801, 802, 741, 736, 726, 361/732, 759; 206/706, 707; 211/41.17
  See application file for complete search history.

(56) References Cited

U.S. PATENT DOCUMENTS

| | | | | |
|---|---|---|---|---|
| 4,002,953 A | * | 1/1977 | Tetlie | 361/756 |
| 4,668,873 A | * | 5/1987 | Ohba et al. | 307/9.1 |
| 5,105,339 A | * | 4/1992 | Olsson et al. | 361/752 |
| 5,400,215 A | * | 3/1995 | Chung | 361/679.01 |
| 5,742,478 A | * | 4/1998 | Wu | 361/704 |
| 5,859,766 A | * | 1/1999 | Van Scyoc et al. | 361/752 |
| 6,034,876 A | * | 3/2000 | Ohno et al. | 361/752 |
| 6,285,556 B1 | * | 9/2001 | Guth et al. | 361/752 |

(Continued)

FOREIGN PATENT DOCUMENTS

| | | |
|---|---|---|
| JP | S53-055751 | 10/1978 |
| JP | S63-110090 | 7/1988 |

(Continued)

*Primary Examiner* — Lisa Lea Edmonds
*Assistant Examiner* — Keith Depew
(74) *Attorney, Agent, or Firm* — Harness, Dickey & Pierce, PLC

(57) ABSTRACT

An electronic device includes a circuit substrate, a bottom case, and a top case. The circuit substrate has a plurality of slits penetrating therethrough. The bottom case has a groove portion positioned at an inside surface of the bottom case such that edge portions of the circuit substrate are slidable and inserted into the groove portion. Besides, a plurality of pin-shaped protrusion portions is provided in the bottom case to be snib-fitted with the top case, and each protrusion portion has a plurality of locking portions at a tip end portion. Each protrusion portion elastically biases the circuit substrate toward the top side of the bottom case and presses the circuit substrate to a top surface of the groove portion by locking the locking portions to the circuit substrate after the locking portions are respectively inserted into the slits.

6 Claims, 5 Drawing Sheets

(56) References Cited

U.S. PATENT DOCUMENTS

| | | | |
|---|---|---|---|
| 6,628,523 B2* | 9/2003 | Kobayashi et al. | 361/736 |
| 6,864,573 B2* | 3/2005 | Robertson et al. | 257/718 |
| 7,075,784 B2* | 7/2006 | Sullivan | 361/679.47 |
| 7,522,427 B2* | 4/2009 | Malmberg et al. | 361/801 |
| 2003/0174472 A1* | 9/2003 | Skofljanec et al. | 361/736 |
| 2004/0257778 A1* | 12/2004 | Lee | 361/752 |
| 2007/0211441 A1* | 9/2007 | Wang | 361/752 |
| 2009/0267465 A1* | 10/2009 | Cheng | 312/223.2 |
| 2013/0058059 A1* | 3/2013 | Min et al. | 361/756 |
| 2013/0141831 A1* | 6/2013 | Lee et al. | 361/206 |

FOREIGN PATENT DOCUMENTS

| | | |
|---|---|---|
| JP | 2003-175780 | 6/2003 |
| JP | 2005-317692 | 11/2005 |
| JP | 2006-110315 | 4/2006 |
| JP | 2007-156553 | 6/2007 |
| JP | 2008-301602 | 12/2008 |
| JP | 2011-166048 | 8/2011 |

* cited by examiner

CIRCUIT BOARD FIXING DEVICE

CROSS REFERENCE TO RELATED APPLICATION

This application is based on Japanese Patent Application No. 2011-287974 filed on Dec. 28, 2011, the contents of which are incorporated herein by reference in its entirety.

TECHNICAL FIELD

The present disclosure relates to an electronic device in which a circuit substrate is accommodated in a case.

BACKGROUND

Conventionally, a circuit substrate accommodated in a case is fixed to a vehicle for protecting an attachment element on the circuit substrate. JP-A-2011-166048 and JP-A-2005-317692 describe a structure without using a fastener such as screw, so as to reduce a cost when the circuit substrate is fixed to the case.

The above structure basically includes a top case and a bottom case. The circuit substrate is inserted between the top case and the bottom case. A force for holding the circuit substrate is affected by an engagement state between the top case and the bottom case, and thereby the circuit substrate may be loosely received in the top case and the bottom case. Since the circuit substrate cannot be strongly received, one of the top case and the bottom case may be readily apart from the other one by an external force. Thus, a displacement may be caused, and the circuit substrate and the element may be affected by an oscillation applied to the cases for a long time.

Further, an acceleration sensor or a gyro sensor may be attached to the circuit substrate. For example, an acceleration sensor for two directions is attached to an airbag electronic control unit (airbag ECU). Since the sensor on the circuit substrate is for measuring parameters relative to movement applied to the vehicle, a no-displacement state is necessary to be maintained between the substrate and the cases. When the displacement occurs, the sensor cannot correctly measure the parameters, and an abnormality such as an erroneous detection may be caused. For example, a security device may activate when the security device should not be activated.

SUMMARY

It is an object of the present disclosure to provide an electronic device, in which a circuit substrate is fixable without using a fastener such as screw, while a displacement of the circuit substrate can be prevented.

According to an aspect of the present disclosure, an electronic device includes a circuit substrate, a bottom case, and a top case. The circuit substrate is provided with an electronic circuit. The bottom case has an opening portion at a top side, and the bottom case receives and holds the circuit substrate. The top case has an opening portion at a bottom side, and is attached to the bottom case from the top side of the bottom case. The circuit substrate has a plurality of slits penetrating through the circuit substrate. The bottom case has a groove portion positioned at an inside surface of the bottom case such that edge portions of the circuit substrate are slidable and inserted into the groove portion. Besides, a plurality of pin-shaped protrusion portions is provided in the bottom case to be snib-fitted with the top case, and each protrusion portion has a plurality of locking portions at a tip end portion. Each protrusion portion elastically biases the circuit substrate toward the top side of the bottom case and presses the circuit substrate to a top surface of the groove portion by locking the locking portions to the circuit substrate after the locking portions are respectively inserted into the slits.

As described above, the circuit substrate is slidable in the groove portion of the bottom case, and the locking portions of the protrusion portions are respectively inserted into the slits. Because the locking portions elastically bias the circuit substrate toward the top side of the bottom case and press the circuit substrate to the top surface of the groove portion, the circuit substrate can be fixed without using a fastener such as screw.

BRIEF DESCRIPTION OF THE DRAWINGS

The above and other objects and advantages of the present disclosure will be more readily apparent from the following detailed description made with reference to the accompanying drawings. In the drawings.

DETAILED DESCRIPTION

Figure 1A:
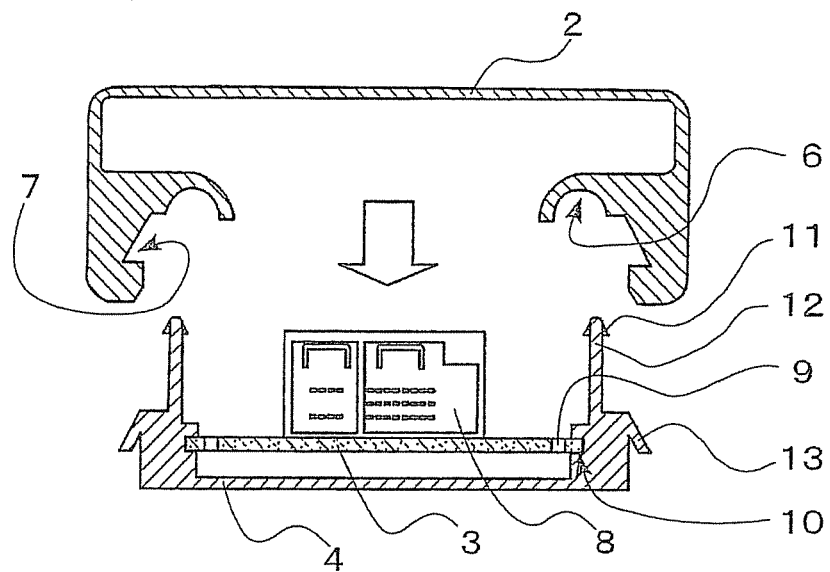
FIG. 1A is a cross-sectional view showing an assembling state of an electronic device.

Embodiments of the present disclosure will be described. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

Hereafter, an electronic device 1 according to embodiments of the present disclosure will be described with reference to the drawings.

(First Embodiment)

Figure 1B:
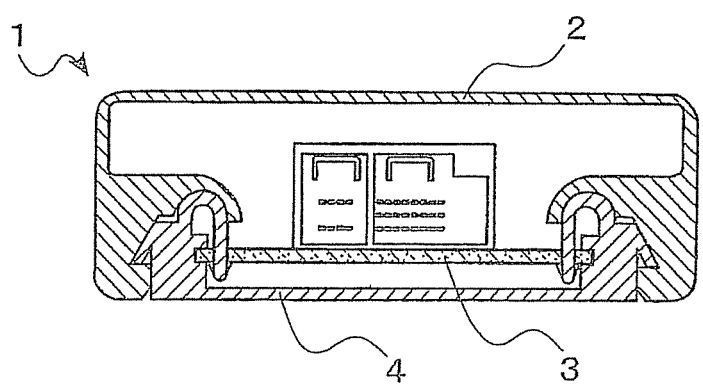
FIG. 1B is a cross-sectional view showing the electronic device after being assembled, which are taken along the line I-I in FIG. 2 according to a first embodiment of the present disclosure.
Figure 2:
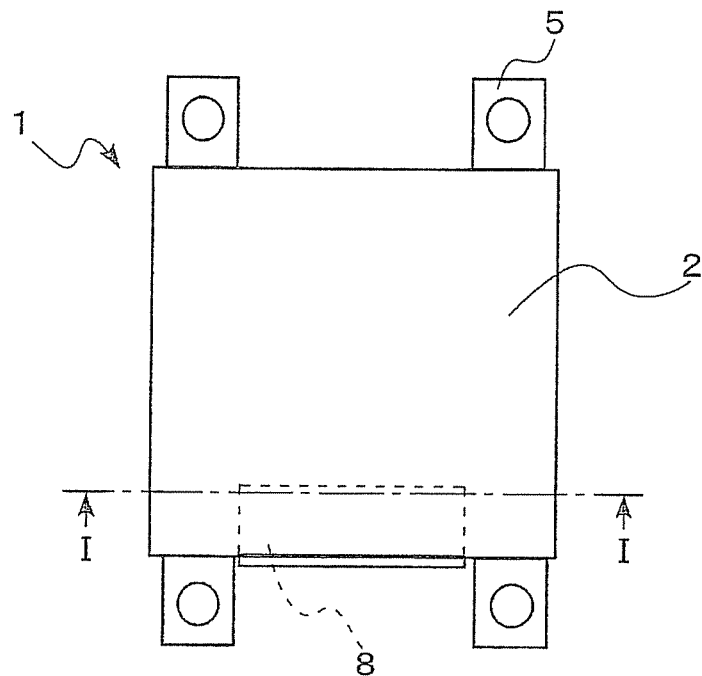
FIG. 2 is a top view showing a top case of the electronic device according to the first embodiment.

FIGS. 1A and 1B are cross-sectional views of the electronic device 1 taken along I-I in FIG. 2. FIG. 1A is a cross-sectional view showing an assembling state of the electronic device 1, and FIG. 1B is a cross-sectional view showing the electronic device 1 after being assembled, according to a first embodiment of the present disclosure As shown in FIGS. 1A and 1B, the electronic device 1 includes a top case 2, a circuit substrate 3, and a bottom case 4. Both the top case 2 and the bottom case 4 are made of resin such as polypropylene (PP).

The top case 2 includes four leg portions 5, a plurality of guide portions 6, and a plurality of engagement portions 7. The leg portions 5 are for fixing the whole electronic device 1, as shown in FIG. 2. Each guide portion 6 is U-shaped so as to guide a protrusion portion 12. Each engagement portion 7 engages with a hook 13 of the bottom case 4 when the top case 2 is assembled to the bottom case 4.

The circuit substrate 3 is a printed-circuit substrate board mounted with a circuit element and a connector 8, and is held in the bottom case 4. The circuit element may be an electronic circuit (not shown). The connector 8 is for connecting to the exterior. Four slits 9 are provided in the circuit substrate 3 to fix the circuit substrate 3 to the top case 2.

Figure 3:
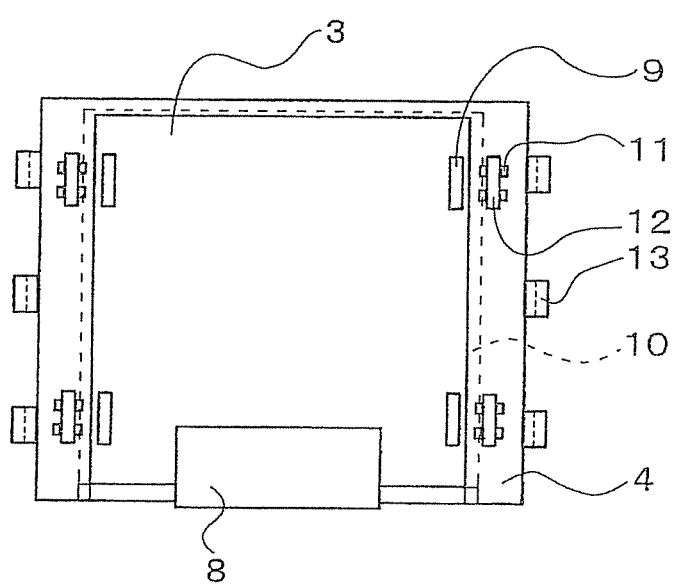
FIG. 3 is a top view showing a bottom case and a circuit substrate of the electronic device according to the first embodiment.
Figure 4A:
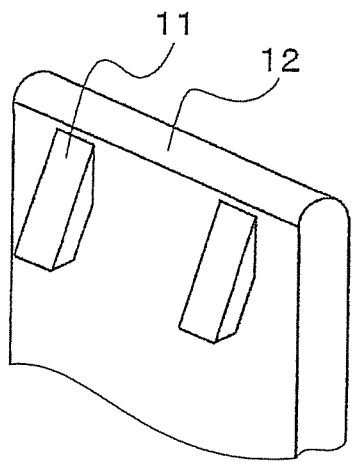
FIGS. 4A and 4B are enlarged views showing a tip end portion of a protrusion portion according to the first embodiment and another embodiment.

The bottom case 4 includes a groove portion 10, four protrusion portions 12 and six hooks 13, for example. The groove portion 10 is provided such that the circuit substrate 3 is slidable in the groove portion 10. Four locking portions 11 are provided at a tip end portion of each protrusion portion 12. As shown in FIG. 3, the locking portions 11 look like squares viewed from top. In the example of FIG. 4A, each locking portion 11 is shaped to expand outside of a surface of the protrusion portion 12 in accordance with increase in distance from the tip of the protrusion portion 12. In this case, the thickness of the locking portion 11 may be set approximately in uniform. While the locking portions 11 are respectively passed through the slits 9, the locking portions 11 are diameter-reduced to pass through the slits 9 by an elasticity of resinous protrusion portion 12 including the locking portions 11, and then return the original shape after being passed through the slits 9. The locking portions 11 are configured to have a snib-shape so as to be prevented from being taken out from the slits 9 after being passed through the slits 9.

An assembling method of the electronic device 1 according to the first embodiment will be described.

The circuit substrate 3 is slid in and inserted into the groove portion 10 of the bottom case 4. FIG. 3 is a top view showing an assembling state where the circuit substrate 3 is completely inserted into the bottom case 4. As shown in FIG. 3, the protrusion portions 12 of the bottom case 4 are provided at positions corresponding to the slits 9 of the circuit substrate 3.

The circuit substrate 3 is set by using jigs (not shown) contacting a bottom surface of the bottom case 4 with a small area. A bottom end portion of the top case 2 may be lower than a bottom surface of the bottom case 4 as in the assembling state of FIG. 5C, or the leg portions 5 may be positioned lower than the bottom end portion of the top case 2. Thus, the jigs are used for pressing the top case 2 sufficiently to the bottom case 4, and for preventing interference between the leg portions 5, the top case 2, and a work table.

Figure 5A:
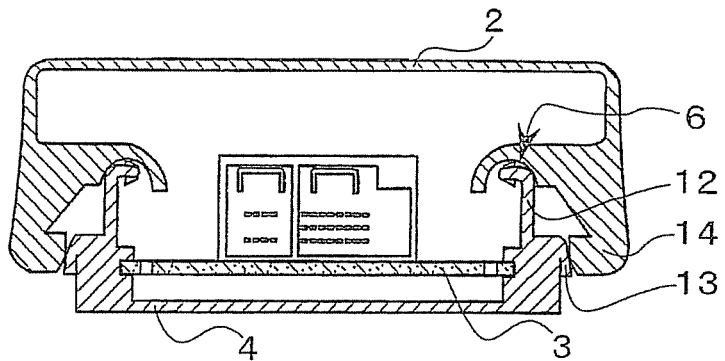
FIG. 5A is a cross-sectional view showing an assembling state of the electronic device.

The top case 2 is covered and pressed from a top side of the bottom case 4. As shown in FIG. 5A, the hooks 13 and a bottom portion 14 of the top case 2 are deformed and bent by the elasticity of resin so that the bottom case 4 can be inserted into the top case 2. The bottom portion 14 is provided to correspond to the hook 13. The tip end portion of the protrusion portion 12 is guided along the guide portion 6 and is bent to a direction opposite to a protruding direction of the protrusion portion 12. The guide portion 6 is provided in the top case 2 such that an inside surface of the guide portion 6 is U-shaped. The locking portions 11 expand like an umbrella, before being passed through the slits 9.

Figure 5B:
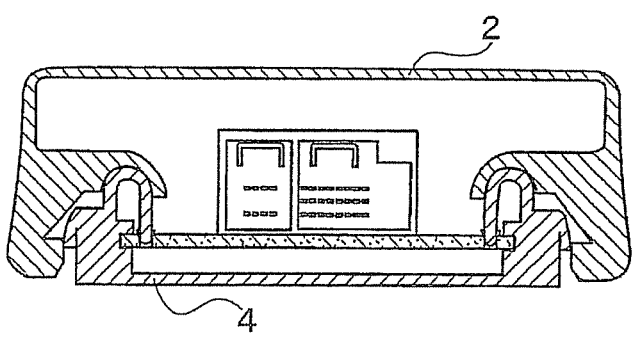
FIG. 5B is a cross-sectional view showing another assembling state of the electronic device.

As shown in FIG. 5B, when the top case 2 is further pressed and lowered, the locking portions 11 are deformed such that a projected area of each locking portion 11 projected in a moving direction decreases. That is, the locking portions 11 are deformed and contracted like an umbrella. In this case, the locking portions 11 can be passed through the slits 9.

Figure 5C:
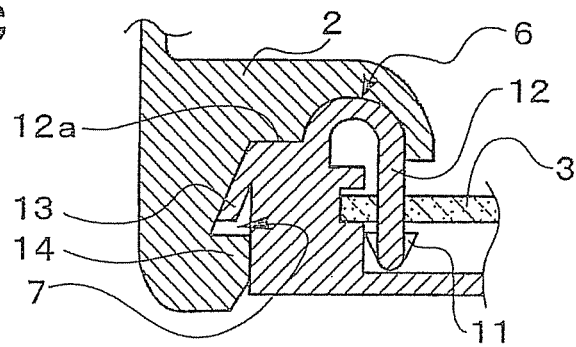
FIG. 5C is an enlarged view showing the protrusion portion and a guide portion in another assembling state of the electronic device.

As shown in FIG. 5C, after the locking portions 11 of the protrusion portion 12 are completely passed through the slit 9, each locking portion 11 returns its original shape. In this case, a base surface 12a of the protrusion portion 12 of the bottom case 4 contacts the top case 2 and thereby the top case 2 cannot be lowered any more. Further, because the hook 13 is inserted into the engagement portion 7, the deformation (bending) of the hook 13 and the bottom portion 14 is disappeared. It is readily to confirm by a sound or a shock transmitted to a hand that the six hooks 13 are respectively inserted into the engagement portions 7 of the top case 2. It may also be confirmed from appearance of whether the bending is disappeared.

Because the tip end portion of the protrusion portion 12 varies much when the protrusion portion 12 is guided along the guide portion 6, the guide portion 6 are set to have a sufficient margin so that the protrusion portion 12 can U-turn. FIG. 5C is a cross-sectional view showing an assembling state where the top case 2 is pressed to the lowest position. In the assembling state of FIG. 5C, the engagement portion 7 of the top case 2 and the hook 13 of the bottom case 4 are not fitted to each other.

Figure 5D:
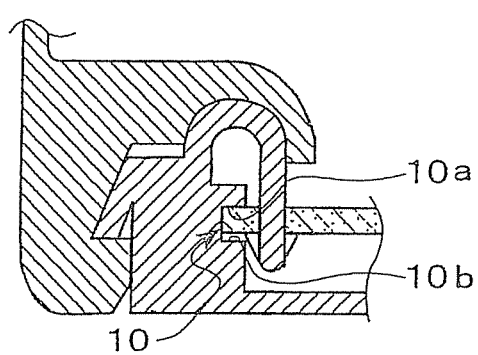
FIG. 5D is an enlarged view showing the protrusion portion and the guide portion after the electronic device being assembled, according to the first embodiment.

When the pressure is disappeared, the protrusion portion 12 tends to return its original shape by the elasticity of resin. A returning force of the protrusion portion 12 applies to the circuit substrate 3 toward the top side of the top case 2 by the locking portions 11. As shown in FIG. 5D, the circuit substrate 3 contacts a top surface 10a of the groove portion 10, and a space is generated between the circuit substrate 3 and a bottom surface 10b of the groove portion 10. Because of the returning force, the hook 13 is fitted to the engagement portion 7 such that the top case 2 cannot be readily taken out from the bottom case 4.

The circuit substrate 3 will always be pressed to the groove portion 10 by the elasticity of the protrusion portion 12. Thus, the circuit substrate 3 can be fixed without using fastener such as screw, and can be received in the bottom case 4 without a moving.

According to the first embodiment, the electronic device 1 includes the circuit substrate 3, the bottom case 4, and the top case 2. The circuit substrate 3 is provided with an electronic circuit. The bottom case 4 has an opening portion at a top side, and the bottom case 4 receives and holds the circuit substrate 3. The top case 2 has an opening portion at a bottom side, and is attached to the bottom case 4 from the top side of the bottom case 4. The circuit substrate 3 has the slits 9 penetrating through the circuit substrate 3. The bottom case 4 has a groove portion 10 positioned at the inside surface of the bottom case 4 such that edge portions of the circuit substrate 3 are slidable and inserted into the groove portion 10. Besides, the pin-shaped protrusion portions 12 are provided in the bottom case 4 to be snib-fitted with the top case 2, and each protrusion portion 12 has a plurality of the locking portions 11 at the tip end portion. Each protrusion portion 12 elastically biases the circuit substrate 3 toward the top side of the bottom case 4 and presses the circuit substrate 3 to the top surface 10a of the groove portion 10 by locking the locking portions 11 to the circuit substrate 3 after the locking portions 11 are respectively inserted into the slits 9.

As described above, the circuit substrate 3 is slidable in the groove portion 10 of the bottom case 4, and the locking portions 11 of the protrusion portions 12 are respectively inserted into the slits 9. Because the locking portions 11 elastically bias the circuit substrate 3 toward the top side of the bottom case 4 and press the circuit substrate 3 to the top surface 10a of the groove portion 10, the circuit substrate 3 can be fixed without using a fastener such as screw. In addition, the circuit substrate 3 is protected by the top case 2 and the bottom case 4. The locking portions 11 may be respectively inserted into the slits 9 by using fingers.

The top case 2 may further have a plurality of guide portions 6 provided such that the inside surface of each guide portion 6 is U-shaped. The protrusion portion 12 is protruded toward the top side of the bottom case 4. When the top case 2 is assembled to the bottom case 4, a configuration in which the locking portions 11 are inserted into the slits 9 may be achieved by guiding and turning the locking portions 11 along the guide portions 6 to the direction opposite to the protruding direction of the protrusion portions 12 to head for the slits 9. Thus, the electronic device 1 can be assembled for a small assembling hours.

(Second Embodiment)

Figure 6A:
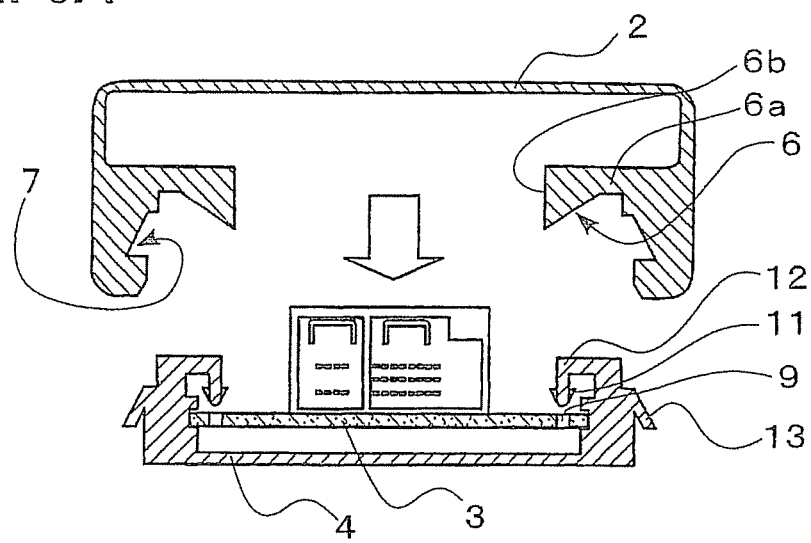
FIG. 6A is a cross-sectional view showing an assembling state of an electronic device.
Figure 6B:
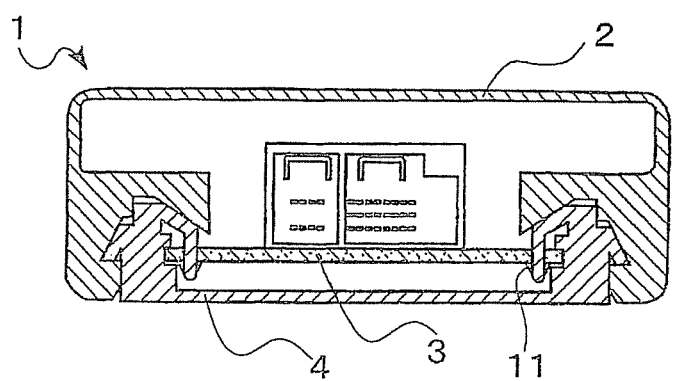
FIG. 6B is a cross-sectional view showing the electronic device after being assembled, according to a second embodiment of the present disclosure.

According to a second embodiment, protrusion portions 12 are provided differently from the protrusion portions 12 in the first embodiment, as shown in FIGS. 6A and 6B. Specifically, the tip end portion of the protrusion portion 12 is positioned at a direct top side of the slit 9 and heads for a bottom side of the bottom case 4. Besides, the guide portion 6 of the top case 2 is also different from the shape of the guide portion 6 in the first embodiment. As shown in FIGS. 6A and 6B, a bottom surface of the guide portion 6 declines from a base part 6a of the guide portion 6 to an inner side surface 6b of the guide portion 6. Except for the protrusion portion 12 and the guide portion 6, other parts of the electronic device 1 according to the second embodiment may be the same as the parts of the electronic device 1 according to the first embodiment.

When the top case 2 is pressed toward the bottom side of the bottom case 4, the guide portions 6 guide the protrusion portions 12 to head for the slits 9 such that the protrusion portions 12 are respectively inserted into the slits 9. As shown in FIG. 6B, when the top case 2 is completely assembled to the bottom case 4, the locking portions 11 of the protrusion portions 12 press the circuit substrate 3 to the top surface 10a of the groove portion 10. The hooks 13 are engaged with the engagement portions 7 such that the top case 2 cannot be readily taken out from the bottom case 4.

The circuit substrate 3 will always be pressed to the groove portion 10 by the elasticity of the protrusion portion 12. Thus, the circuit substrate 3 can be fixed without using fastener such as screw, and can be received in the bottom case 4 without a moving.

According to the second embodiment, the bottom surface of the guide portion 6 declines from the base part 6a of the guide portion 6 to the inner side surface 6b of the guide portion 6. The protrusion portion 12 is provided in the bottom case 4 such that the tip end portion is positioned at the direct top side of the slit 9 and heads for the slit 9. When the top case 2 is assembled to the bottom case 4, the locking portions 11 are inserted into the slit 9 because the protrusion portion 12 is pressed toward the bottom side of the bottom case 4 along the guide portion 6.

Then, the circuit substrate 3 and the top case 2 can be fitted to each other by pressing the top case 2 to the bottom case 4.

Such changes and modifications are to be understood as being within the scope of the present disclosure as defined by the appended claims.

The protrusion portion 12 may be inserted into the slit 9 by a finger after the circuit substrate 3 is slid in the bottom case 4. In this case, the top case 2 may be provided to protect the circuit substrate 3 without a structure having a member such as the guide portion 6. Thus, the processing cost of die and mold for injection molding can be reduced.

Figure 4B:
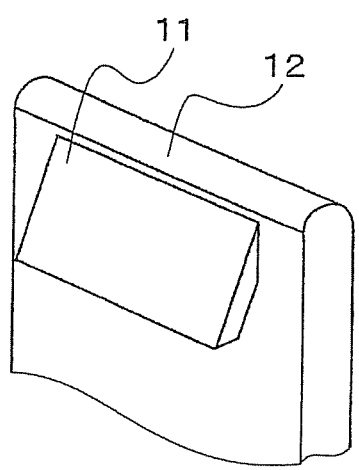

As shown in FIG. 4B, the locking portions 11 may be provided in a manner that one locking portion 11 is placed at a side surface of the protrusion portion 12. Alternatively, the locking portions 11 may be provided in a manner that two locking portions 11 are respectively placed at two opposing side surfaces of the protrusion portion 12.

The material of the top case 2 and the bottom case 4 is not limited to the PP. Other resin may be used, such as polybutylene terephthalate (PBT), polyethylene-telephthalate (PET), polycarbonate (PC), ABS resin, or polymer alloy. The resin may be conductive grade, or may include filling material such as glass fiber or carbon fiber. Further, the material of the top case 2 and the bottom case 4 may be different from each other.

According to a first aspect of the present disclosure, an electronic device includes a circuit substrate, a bottom case, and a top case. The circuit substrate is provided with an electronic circuit. The bottom case has an opening portion at a top side, and the bottom case receives and holds the circuit substrate. The top case has an opening portion at a bottom side, and is attached to the bottom case from the top side of the bottom case. The circuit substrate has a plurality of slits penetrating through the circuit substrate. The bottom case has a groove portion positioned at an inside surface of the bottom case such that edge portions of the circuit substrate are slidable and inserted into the groove portion. Besides, a plurality of pin-shaped protrusion portions is provided in the bottom case to be snib-fitted with the top case, and each protrusion portion has a plurality of locking portions at a tip end portion. Each protrusion portion elastically biases the circuit substrate toward the top side of the bottom case and presses the circuit substrate to a top surface of the groove portion by locking the locking portions to the circuit substrate after the locking portions are respectively inserted into the slits.

As described above, the circuit substrate is slidable in the groove portion of the bottom case, and the locking portions of the protrusion portions are respectively inserted into the slits. Because the locking portions elastically bias the circuit substrate toward the top side of the bottom case and press the circuit substrate to the top surface of the groove portion, the circuit substrate can be fixed without using a fastener such as screw.

According to a second aspect of the present disclosure, a bottom end portion of the top case may include a plurality of leg portions for attaching the electronic device to a subject. The top case may be positioned to cover the bottom case. Thus, the bottom case receiving and holding the circuit substrate can be assembled to the whole electronic device without contacting an assembling surface.

According to a third aspect of the present disclosure, the protrusion portion may be provided to protrude toward one of the top side and the bottom side of the bottom case. In this case, the protrusion portion can be inserted into the slit by a finger or a tool, and the circuit substrate can be readily fixed to the bottom case without a fastener such as screw.

According to a fourth aspect of the present disclosure, the top case may further have a plurality of guide portions provided such that the inside surface of each guide portion is U-shaped. The protrusion portion may be protruded toward the top side of the bottom case. The locking portions may be respectively guided along the guide portions and bent to the direction opposite to the protruding direction of the protrusion portions to head for the slits, and may be respectively inserted into the slits, when the top case is assembled to the bottom case. Thus, the electronic device can be assembled for a small assembling hours.

According to a fifth aspect of the present disclosure, the bottom surface of the guide portion may decline from a base part of the guide portion to an inner side surface of the guide portion. The protrusion portion may be provided in the bottom case such that the tip end portion is positioned at the top side of the slit and heads for a bottom side of the bottom case. The locking portions are respectively inserted into the slits due to the protrusion portions pressed toward the bottom side of the bottom case along the guide portions, when the top case is assembled to the bottom case.

According to a sixth aspect of the present disclosure, the circuit substrate may be provided with an acceleration sensor or a gyro sensor. In this case, the electronic device may be used as an airbag ECU, a sensor substrate, or an electronic stability control ECU (ESC ECU).

While the present disclosure has been described with reference to the embodiments thereof, it is to be understood that the disclosure is not limited to the embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. An electronic device comprising: a circuit substrate provided with an electronic circuit;
    a bottom case that is made of resin, has an opening portion at a top side, and receives and holds the circuit substrate; and
    a top case that has an opening portion at a bottom side, and is attached to the bottom case from the top side of the bottom case, wherein
    the circuit substrate has a plurality of slits penetrating through the circuit substrate,
    the bottom case has a groove portion positioned at an inside surface of the bottom case such that edge portions of the circuit substrate are slidable and inserted into the groove portion, and
    the bottom case is provided with a plurality of pin-shaped protrusion portions, each protrusion portion has a plurality of locking portions at a tip end portion, and each protrusion portion has a snib-shape and elastically biases the circuit substrate toward the top side of the bottom case and presses the circuit substrate to a top surface of the groove portion by locking the locking portions to the circuit substrate after the locking portions are respectively inserted into the slits from a top side of the circuit substrate.

2. The electronic device according to claim 1, wherein
    a bottom end portion of the top case includes a plurality of leg portions for attaching the electronic device to a subject, and
    the top case is positioned to cover the bottom case.

3. The electronic device according to claim 1, wherein the protrusion portion is provided to protrude toward one of the top side and the bottom side of the bottom case.

4. The electronic device according to claim 1, further comprising
    a plurality of guide portions provided in the top case such that an inside surface of each guide portion is U-shaped, wherein:
    the protrusion portion is provided to protrude toward the top side of the bottom case, and
    the locking portions are respectively guided along the guide portions and bent to a direction opposite to a protruding direction of the protrusion portions to head for the slits, and are respectively inserted into the slits, when the top case is assembled to the bottom case.

5. The electronic device according to claim 1, further comprising
    a plurality of guide portions provided such that a bottom surface of each guide portion declines from a base part of the guide portion to an inner side surface of the guide portion, wherein
    the protrusion portion is provided in the bottom case such that the tip end portion is positioned at a direct top side of the slit and heads for a bottom side of the bottom case, and the locking portions are respectively inserted into the slits of the circuit substrate due to the protrusion portions pressed toward the bottom side of the bottom case along the guide portions, when the top case is assembled to the bottom case.

6. The electronic device according to claim 1, wherein the circuit substrate is provided with an acceleration sensor or a gyro sensor.

* * * * *